Sept. 12, 1967 E. J. METS ETAL 3,341,380
METHOD OF PRODUCING SEMICONDUCTOR DEVICES
Filed Dec. 28, 1964

INVENTORS:
FINIS E. GENTRY,
EDWIN J. METS,
BY Urban H. Faubion
THEIR ATTORNEY.

3,341,380
METHOD OF PRODUCING SEMICONDUCTOR DEVICES

Edwin J. Mets and Finis E. Gentry, Skaneateles, N.Y., assignors to General Electric Company, a corporation of New York Filed Dec. 28, 1964, Ser. No. 421,278
4 Claims. (Cl. 148—187)

ABSTRACT OF THE DISCLOSURE

Method of producing semiconductor junction devices which insures bulk breakdown, the method includes starting with a semiconductor body and forming an oxide coating on the body, forming a window in the oxide so that it is surrounded by the oxide and diffusing into the surface through the window and also through the oxide in order to produce a low resistivity region of one junction depth surrounded by a high resistivity region of a lesser junction depth under the oxide.

Figure 1:
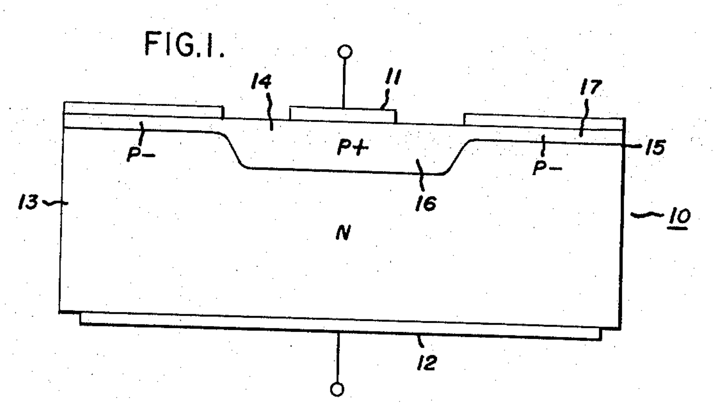

This invention relates to a means for improving the characteristics of semiconductor materials which have at least one internal junction between two zones of different conduction characteristics and the characteristics of devices which utilize such materials. The invention is directed toward means for increasing the reverse or inverse voltage which may be applied to such devices without a breakdown and to increase the ability of such devices to dissipate power when the device does break down in the reverse direction. Reverse, or inverse, voltage as used here is a voltage which is of a polarity that would normally cause conduction to take place across a given junction in the direction of high impedance. The invention provides methods for producing device structures which make it practical to utilize pellets of the type referred to in the art as planar and planar passivated for high voltage applications.

A junction between zones of a semiconductor material having opposite type conduction characteristics provides a low resistance path to an electric current flowing across the junction in one direction, and a high resistance path to current flow in the opposite direction. A voltage which is of such a polarity as to force a current across the junction in the direction of higher resistance is the inverse voltage referred to above. When an inverse voltage is applied across the junction between zones of semiconductor material having an excess of free electrons (N type conduction characteristics) and an excess of positive holes (P or positive conduction characteristics) respectively, the region surrounding the junction becomes deficient of free electrons and positive holes (known as carriers). The reason that this happens is that when a positive voltage is applied at the negative type conduction zone and a negative voltage applied at the positive type conduction zone, the positive carriers are attracted to the negative voltage terminal and the negative carriers are attracted to the positive voltage terminal. Thus, the carriers on both sides of the junction are attracted away from the junction to form a region (called the depletion region or space charge layer). The depletion region is a dielectric because of the deficiency of carriers of either type.

The dielectric depletion region is highly resistive and is capable of withholding high voltages. For example, in most practical devices, the dielectric depletion region is capable of withstanding a reverse voltage of several hundred volts without breaking down through the bulk of the material. However, most devices are not capable of withstanding more than a relatively small fraction of the voltage which the bulk will hold in the reverse direction (either transient or steady state) due to the fact that breakdown first occurs across or around the surface. For this reason, it is said that most such devices are surface limited.

The fact that most rectifiers are surface limited places severe limitations on the usefulness of the devices. To begin with, it means that the device cannot be used in circuits where reverse voltages (either steady state or transient) of over a few hundred volts are likely to occur without taking special precautions (frequently elaborate) to prevent application of the reverse voltage directly across the device.

As serious as this drawback appears, it is perhaps not as serious as other disadvantages which occur because such devices are surface limited, viz, device instability, and destruction of the device upon surface breakdown in the reverse direction.

Device instability is most frequently due to the fact that the condition of the semiconductor surface changes. The characteristics of such devices vary considerably with the condition of the surface. Therefore, unless some precautions are taken to assure that the surface condition will not change appreciably during the use of the device, the device stability is very poor. Actually it is much more difficult to control condition of the surface of the material than it is to control the characteristics of the bulk and it is certainly more difficulty to control or prevent changes in surface condition than to control the essentially constant bulk characteristics. The fact of the matter is that even with elaborate precautions such as utilizing various kinds of surface treatment and placing the semiconductor material in an evacuated hermetically sealed container, the predominant failure mechanism of rectifier devices during operation is a result of surface degradation.

As to the point concerning device destruction, it is a well recognized fact that typical rectifiers (which are surface limited devices) may be permanently damaged or destroyed by only a few watts of power absorbed during breakdown, as from a very brief voltage transient, in the reverse or blocking direction. The fact that the bulk material can dissipate a great deal of energy is readily apparent by taking, as an example, a typical silicon rectifier and considering that such devices can, at least momentarily, dissipate 1000 watts of heat in the forward direction of current flow without any damage whatsoever. This apparent anomaly can be explained by considering the fact that for conduction in the forward direction, current and its attendant heat losses spread out equally over the entire junction area, permitting maximum utilization of the entire rectifier cooling mechanism and its thermal capacity. However, in the reverse direction, the rectifier surface current under momentary high peaks of blocking voltage finds some microscopic flaw or weakness at which to concentrate. Such weak spots usually occur at the junction surface where the rectifying junction emerges from the silicon pellet. At these minute spots, a fraction of a watt of concentrated heat may be sufficient to melt and destroy the blocking properties of the rectifier, regardless of size of the rectifier. The inverse voltage problem is so critical that transient rating in the reverse direction is done on the basis of voltage rather than energy.

When failure due to reverse voltage applied to the rectifier takes place through the bulk of the material instead of over the surface, the device can dissipate approximately as much energy, both steady state and transient, in its reverse direction as in its forward direction. When the device breaks down through the bulk and current flows in the reverse direction, the breakdown is called "avalanche breakdown" (sometimes mistakenly called "zener breakdown"). Avalanche breakdown of a silicon rectifier diode is an inherently nondestructive characteristic that is widely used at relatively low power and voltage levels as a constant voltage reference and regulator in so called "zener" diodes. Like a zener diode, a rectifier operated within its thermal limitations maintains substantially constant voltage across it in the avalanche region regardless of current in this region. As long as the energy is limited by the external circuit to the thermal capability of the device, no damage results from true avalanche action. Hence, a device with uniform avalanche breakdown occuring at a voltage below that at which local dielectric surface breakdowns occur, can dissipate hundreds of times more reverse energy with transient over-voltage conditions than one where the converse is true.

Perhaps it is well to point out that breakdown is likely to occur at the surface of the semiconductor material because of the high voltage gradient at the surface of the device. Stated in another way, breakdown occurs at the surface due to high concentration of electric fields at the surface. As a practical matter, the place where the electric field is usually of the highest intensity is in the vicinity of the junction between the two zones of opposite conduction type characteristics. For example, the transition region or junction between the two different conduction zones may be on the order of $10^{-3}$ centimeters in thickness. Thus, it is readily seen that a very strong electric field (high electric field intensity) occurs at a surface area of the body intercepted by the junction.

A number of approaches have been developed to provide semiconductor devices wherein breakdown due to reverse voltage occurs within the bulk of the material of the semiconductor device instead of at the surface and semiconductor devices with surface stability problems largely eliminated.

One approach to minimizing surface problems is known in the art as the planar passivation technique. This method involves masking a semiconductor body of one conductivity type with an oxide and either forming or leaving an opening in the oxide. The opposite conductivity type doping material is diffused into the body through the opening to form a junction which comes to the surface of the body under the oxide layer. The oxide is an insulating layer which protects (passivates) the surface of the body, particularly where the junction comes to the surface. The planar passivation technique works well for small signal, low voltage devices but it is not generally practical for devices requiring avalanche breakdown characteristics in excess of 500 volts due to process limitations. Sharp junction corners (i.e., small junction radii) and the phenomenon known as pileup under the oxide are two principal factors which generally limit the breakdown voltage of devices manufactured by the planar process.

Device structures, particularly junction configurations, which can take advantage of the best features of the planar process (e.g., protected pellet surface) and at the same time extends the range of inverse voltage the device can withstand prior to breakdown and insures that the breakdown will occur in avalanche through the bulk are described and claimed in copending patent application Ser. No. 421,380, filed concurrently herewith in the name of Finis E. Gentry, entitled "Semiconductor Devices" and assigned to the assignee of the present invention, now abandoned in favor of its continuation application Ser. No. 614,753 filed Feb. 8, 1967. The resulting distribution of energy throughout the volume of the device structures provided safe, non-destructive dissipation of voltage transients which would otherwise result in destruction of the device.

The present invention relates to methods of producing device and junction structures described in the Finis E. Gentry application supra. The structures provided in that application each include a semiconductor body having two major faces provided with at least two zones of opposite conductivity type defining a rectifying junction therebetween with one of the zones made up of two regions, one called internal because at least part of it occupies a portion of one major face of the pellet internally spaced from the body periphery, and a region which occupies a portion of the same major face, surrounding the internal region and having a sheet resistance which is higher than that of the internal region by an amount necessary to allow the space charge layer associated with the junction to spread over substantially the entire surface of the surrounding region prior to avalanche breakdown. The junction and surrounding region may be covered with an oxide or other insulating coating.

Accordingly, then, in carrying out the present invention, a method is provided which includes utilizing a semiconductor body with at least one zone of one conductivity type adjacent one major surface, masking at least a portion of one major surface of the body surrounding an area to be heavily converted with an insulating material and diffusing at least one impurity of conductivity type opposite to that of the one zone into the major surface masked for a time sufficient heavily to convert the unmasked portion and lightly convert the surface immediately under the mask.

Figure 2:
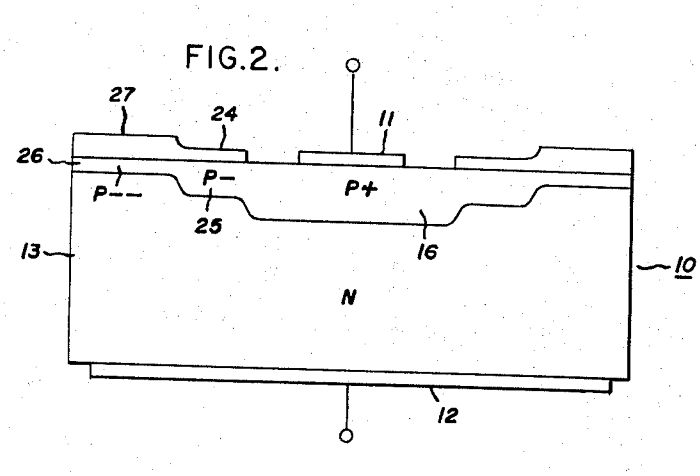
Figure 3:
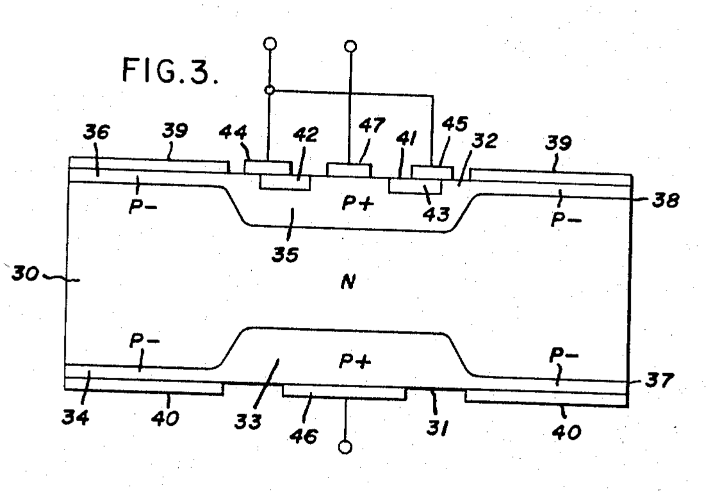

The novel features which are believed to be characteristic of the invention are set forth with particularly in the appended claims. The invention itself, however, both as to its organization and method of operation together with further objects and advantages thereof may best be understood by reference to the following description taken in connection with the accompanying drawings in which:

FIGURES 1 and 2 are central vertical sections through semiconductor recifier pellets which utilize the teachings of the present invention and which are used in the explanation of the method of producing the structure; and FIGURE 3 is a central vertical section through a semiconductor body which utilizes teachings of the present invention and illustrates the method as employed in making NPNP devices such as controlled rectifiers.

In FIGURE 1, the cross-section of a segment of a pellet 10 of single crystal semiconductive material such as silicon or germanium is depicted in a somewhat diagrammatic fashion. The pellet for many practical semiconductor devices will be circular so that it has the general shape of a round coin and in others it may be square or rectangular. In order to have a practical device, it is necessary to provide low resistance electrical contacts 11 and 12 (ohmic contacts) on the upper and lower major faces of pellet 10. The pellet 10 has two zones of different conductivity type, viz, a zone 13 of N type conductivity adjacent the lower major face and an upper zone 14 of P type conductivity adjacent the upper major face. The boundary or juncture between the two zones 13 and 14 defines a PN junction 15. In order to make the pellet 10 bulk limited rather than surface limited and reduce the peak surface electric field in the region of junction 15 under conditions of reverse bias, the upper P type zone 14 is provided with two regions 16 and 17 of the same type conductivity but of different resistivity and sheet resistance. Upper P type zone 14 has the central region 16 marked P+ to indicate its highly doped (has a large number of P type carriers) and the region 17 which surrounds the P+ region 16 at the upper major surface of pellet 10 and is marked P− to indicate that it is lightly doped (has a small number of P type carriers) relative to the material around it. Therefore, the central P+ type region 16 is highly conductive (has a low resistivity and sheet resistance) and the surrounding P− type region 17 has a low conductivity (high resistivity and high sheet resistance).

In order to establish the conductivities and dimensions of the structural elements of pellet 10 for later discussion and for explanation of the way the device works and the method of producing the structure, illustrative parameters are given here. In one example, the pellet 10 is a square cut pellet 70 mils on each side and 8 mils thick. The starting material is N conductivity type having a resistivity of 18 ohm centimeter. A silicon dioxide insulating layer 18 of between 8,000 and 12,000 angstroms in thickness is formed over the upper major face of the pellet 10 and a window 19 about 50 mils in diameter is etched over the central region 16 which is to be converted to P+ type material. In one device, a simultaneous boron and gallium diffusion was carried out to form a central P+ region 16 with a depth of 0.9 mil and a surface impurity concentration (determined by the boron) of $8\times10^{18}$ atoms per cubic centimeter and a surrounding space charge spread zone 17 0.8 mil thick with a surface impurity concentration of about $7\times10^{16}$ atoms per cubic centimeter determined by diffusion of the gallium through the oxide layer 18.

Although these devices represent a distinct improvement over prior art devices, still better results are obtained by taking the oxide masked pellet 10 with the 50 mil diameter window etched in the oxide and diffusing with boron as the single source. The central P+ region 16 is boron diffused to a depth of about 1.8 mils with a surface concentration of about $1\times10^{20}$ atoms per cubic centimeter and at the same time the surrounding P− region 17 is diffused through the oxide 18. Thus, the surrounding P− region 17 is about .46 mil thick and has a surface concentration of about $1\times10^{15}$ atoms per cubic centimeter. This entailed a diffusion of boron for 35 hours at 1235° C.

The object in providing the high resistivity region 17 around the central low resistivity region 16 is to force the electric field to spread prior to avalanche breakdown of the junction. It will be remembered that a primary reason for surface breakdown is a concentration of the electric field at the surface and in the region of the junction. Since the region 17 forces the electric field at the pellet surface to spread, it is called, for convenience, the field or space charge spread region. One way to look at the operation of the device is to consider that the field spread is caused or forced by doping he field spread region 17 so lightly (providing a high sheet resistance) that all of the carriers in the region are "used up" prior to avalanche breakdown. Note that this presupposes that region 17 has carriers of the same conductivity type as found in the rest of zone 14 (consequently opposite to the carriers on the opposite side of junction 15). Thus, making field spread region 17 intrinsic or slightly N type does not give the same field spread function. From the above discussion, it may be concluded that the technique of zone spreading region 17 is governed by the number of impurity atoms (and sheet resistance) found in the region. For a given zone spreading effect the greater the concentration of impurity atoms present, the thinner the zone spreading region must be and conversely, the lower the concentration of impurity atoms, the thicker it may be.

Diffusion through the oxide coating for a sufficient time to convert the material just under the oxide also has the beneficial effect of making the junction corners rounder than would be the case with the conventional planar diffusion cycle. This helps prevent low voltage breakdown in the device.

It has been determined that the voltage required to force the space charge region to the surface should be between 20 and 70% of the desired breakdown voltage. In the 100 to 2000 volt range the charge uncovered between space charge layer in the P− region 17 does not vary much over this breakdown voltage range. Calculations (verified by tests) indicate that the sheet resistance $R_S$ for the P− field spread region 17 should be greater than 1000 ohms per square. This sheet resistance is calculated in the same manner as in the literature and will serve as a guide in determining the diffusion cycle or cycles required for conversion of the material under the oxide.

A similar semiconductor device is illustrated in FIGURE 2. In this embodiment, elements which correspond to FIGURE 1 are given the same reference numerals. This embodiment differs from that of FIGURE 1 in that the field spread region 17 is divided into two sections or steps. The first is a P− section 25 which immediately surrounds the central P+ type region 16 and performs the same function as the P− region 17 described in FIGURE 1. In addition, a second section 26 of like conductivity but higher sheet resistance immediately surrounds the P− section 25. The section 26 is labeled P−− to indicate that it has higher sheet resistance than the P− section 25. The additional section 26 of higher sheet resistance provides an additional means to spread the electric field over the surface. Calculations and tests indicate that the sheet resistance of each additional spreading section (e.g., section 26) should be about 30% greater than the adjacent section. Thus, the sheet resistance of section 25 should be 1000 ohms or greater and the additional section 26 should be 1300 ohms or greater. It will be noted that the thickness of the insulating silicon dioxide layer 24 which is immediately over the P−− section 26 (labeled 27) is thicker than that which is over the P− section 25. This is done as a step in manufacturing the device. The thickness of the two parts of the layer 24 are controlled so that the conversion through the oxide takes place in the right amount to give the desired sheet resistances to the sections 25 and 26 of space charge spread region 17 and the central P+ region 16.

The device of FIGURE 3 utilizes the invention in structure which is useful for controlled rectifiers. That is, the structure of FIGURE 3 is an NPNP device. This figure is also used to describe how the invention is employed to form a multijunction device.

The device of FIGURE 3 is made starting with a body of N conductivity type material 30 which ultimately forms the internal N type zone of the device. P type zones 31 and 32 are diffused into the upper and lower major faces of the body 30 simultaneously and through an oxide mask as previously described. That is, this diffusion is done in such a manner that the lower P type emitter zone 31 is composed of a central P+ type region 33 surrounded by a P− space charge spread region 34 and the upper P type zone 32 is composed of a central P+ type region 35 surrounded by a P− space charge spread region 36. Thus, it is seen that a lower emitter junction 37 is formed between lower emitter 31 and N type zone 30 and a collection junction 38 is formed between the upper P type zone 32 and the internal N type zone 30. Each of these junctions performs as described in connection with junction 15 of the rectifier of FIGURE 1 to spread the electric field in the space charge spread regions under reverse bias conditions (reverse bias for the particular junction). As illustrated here, insulating layers 39 and 40 respectively are provided on the upper and lower space charge spread regions 36 and 34 respectively so that the critical surface region of the pellet is, in effect, passivated. These oxide layers are preferably a part of the original masking utilized in the formation of the device junctions.

In order to complete the NPNP structure, an upper N type emitter zone 41 is diffused into the upper P type zone 32. In this embodiment the upper N type emitter zone 41 is illustrated as being formed of two discrete N type regions 42 and 43. This is not necessary, however, it provides a very good means of forming emitter electrodes 44 and 45 which extend across the emitter junctions formed between the N type emitter regions 42 and 43 on to the upper P+ type region 35. The advantages of the shorted emitter construction is described fully in copending patent application, Ser. No. 838,504 filed Sept. 8, 1959, in the name of Richard W. Aldrich and Nick Holonyak, Jr. and assigned to the assignee of the present invention. A lower emitter electrode 46 is provided on the lower P+ type region 33. Lower emitter electrodes 46 and the upper emitter electrodes 44 and 45 form the main device electrodes. For purposes of turning the device on and off, a gate electrode 47 is provided between regions 42 and 43 of upper emitter zone 41. Since operation of the controlled rectifier forms no part of the present invention and since it is so well known in the art, it is not described again here.

It will be recognized that if the lower P type zone 33 of pellet 30 were not formed, the device structure corresponds to that of a planar transistor, particularly if the upper N type zone is formed in a single region rather than the two. Thus, it is seen that the method described is also useful in the formation of transistors.

While particular structures wherein the invention is particularly useful have been illustrated and described, it will, of course, be understood that the invention is not limited thereto since many modifications varied to fit particular operating requirements and environments will be apparent to those skilled in the art. The invention is capable of broad application and its peculiar properties taken advantage of in semiconductor devices utilizing materials other than those described and such devices formed in other ways without departing from the concept of the invention. Further, it is contemplated that duals of the devices, i.e., devices which are essentially the same in structure but having opposite conductivities for the zones illustrated are well within the scope of the invention. Those skilled in the art will recognize that other diffusion sources may be employed to produce N type conversion through an oxide layer. Accordingly, the invention is not considered limited to the examples chosen for the purposes of disclosure and it is contemplated that the appended claims will cover any such modifications as fall within the true spirit and scope of the invention.

What we claim as new and desire to secure by Letters Patent of the United States is:

1. The method of producing a semiconductor device starting with a body of semiconductor material having a zone of one conductivity type material adjacent one major surface comprising the steps of producing a coating of an insulating material on at least the said one major surface of said semiconductor body, removing a portion of said insulating coating thereby exposing an area on the one surface and leaving said insulating material around the periphery of said area, and diffusing an impurity of a conductivity type opposite to that of the said zone into said one major surface for a time sufficient simultaneously to convert a region of said body immediately under said insulating layer to a high resistivity region of opposite conductivity type and a second region within said high resistivity region wherein said insulating coating is removed to said opposite conductivity type region of low resistivity and greater depth than said high resistivity region whereby the junction transition between the two regions is gradual.

2. The method of producing a semiconductor device having surface stability and body breakdown characteristics starting with a body of material having a zone of material of N conductivity type material adjacent one major surface, forming an oxide coating of between eight and twelve thousand angstroms thickness at least on said one major surface, removing a portion of said oxide coating from at least one portion within the surface area, and diffusing the dopant boron into said one major surface for a time sufficient simultaneously to convert a first region of said body immediately under said insulating layer to a high resistivity region of P conductivity type and a second region within said first region to P conductivity type of lower resistivity and greater depth than said first region and also producing a transition region between first and second region which is gradual.

3. The method of producing a semiconductor device with bulk breakdown characteristics and stable surface characteristics starting with a body of semiconductor material having a zone of material of one conductivity type adjacent one major surface comprising the steps of forming a coating of an insulating material having a greater thickness around its outer periphery than at the center on at least the said one major surface of said semiconductor body, removing a portion of the thinner part of said inner insulating coating thereby exposing an area on the one surface and leaving insulating material around the periphery of said area, and diffusing an impurity of a conductivity type opposite to that of said zone into said one major surface for a time sufficient simultaneously to convert region of said body immediately under said insulating layer to a high resistivity region of opposite conductivity type and a second region within said high resistivity region where said oxide coating is removed to an opposite conductivity type region of low resistivity and greater depth than said high resistivity region whereby the junction transition between the two regions is gradual.

4. The method of producing a semiconductor device having surface stability and body breakdown characteristics starting with a body of material having a zone of N conductivity type material adjacent one major surface, forming an oxide coating on said one major surface having an internal region of between 8,000 and 12,000 angstroms thickness surrounded by an external region having a thickness of between 1,000 and 2,000 angstroms greater than the thickness of said internal region, removing a portion of said oxide coating from at least one portion within the said internal region whereby the surface area exposed by said removal is surrounded by a portion of the said thinner internal oxide region, and diffusing the dopant boron into said one major surface for a time sufficient simultaneously to convert a region of said body immediately under said internal and external regions of said insulating layer and also in the region where said oxide coating is removed to P conductivity type material having a low resistivity region of a given junction depth where said oxide coating is removed a higher resistivity region of less junction depth under said oxide coating having a thickness of between 8,000 and 12,000 angstroms and still a higher resistivity region of still less junction depth under the thicker peripheral oxide coated region.

References Cited

UNITED STATES PATENTS

| | | | |
|---|---|---|---|
| 3,007,090 | 10/1961 | Rutz | 148—33.5 X |
| 3,064,167 | 11/1962 | Hoerni | 148—189 |
| 3,147,152 | 9/1964 | Mendel. | |
| 3,166,694 | 1/1965 | Mueller | 148—33.5 X |
| 3,183,129 | 11/1965 | Tripp | 148—190 X |
| 3,200,019 | 8/1965 | Scott. | |
| 3,203,840 | 8/1965 | Harris | 148—189 |
| 3,226,611 | 12/1965 | Haenichen | 148—33.5 X |
| 3,226,613 | 12/1965 | Haenichen | 148—33 |

HYLAND BIZOT, *Primary Examiner.*